United States Patent [19]
Lake

[11] Patent Number: 5,605,547
[45] Date of Patent: Feb. 25, 1997

[54] METHOD AND APPARATUS FOR MOUNTING A COMPONENT TO A SUBSTRATE USING AN ANISOTROPIC ADHESIVE, A COMPRESSIVE COVER FILM, AND A CONVEYOR

[75] Inventor: Rickie C. Lake, Boise, Id.

[73] Assignee: Micron Technology, Inc., Boise, Id.

[21] Appl. No.: 410,889

[22] Filed: Mar. 27, 1995

[51] Int. Cl.[6] .................. H01L 21/288; H01L 21/58; H01L 21/603
[52] U.S. Cl. .................. 29/25.01; 437/183; 437/216
[58] Field of Search .................. 437/216, 209, 437/926, 183, 212, 222; 156/583.5, 552, 555; 29/743, 25.01

[56] References Cited

U.S. PATENT DOCUMENTS

| | | | |
|---|---|---|---|
| 4,382,833 | 5/1983 | Coyle et al. | 156/382 |
| 4,729,166 | 3/1988 | Lee et al. | 29/877 |
| 4,863,546 | 9/1989 | Melzer et al. | 156/308.2 |
| 4,933,042 | 6/1990 | Eichelberger et al. | 156/239 |
| 4,997,507 | 3/1991 | Meyer | 156/286 |
| 5,107,586 | 4/1992 | Eichelberger et al. | 29/830 |
| 5,292,388 | 3/1994 | Candore | 156/64 |
| 5,352,629 | 10/1994 | Paik et al. | 437/189 |
| 5,365,656 | 11/1994 | Dahringer et al. | 29/840 |
| 5,467,253 | 11/1994 | Wood et al. | 324/158.1 |
| 5,490,900 | 2/1996 | Held | 156/555 |
| 5,495,179 | 2/1996 | Wood et al. | 324/755 |

FOREIGN PATENT DOCUMENTS 2659344  9/1991  France .................. 156/285

OTHER PUBLICATIONS

"Thin Foil Laminator" R. F. Penoyer, IBM Technical Disclosure Bulletin vol. 9 No. 10 p. 1411. Mar. 1967.
"Poly–Flex Circuits News Release", Issue 823, Nov. 14, 1994, author unknown.

*Primary Examiner*—David E. Graybill
*Attorney, Agent, or Firm*—Stephen A. Gratton

[57] ABSTRACT

A method and apparatus for mounting a component, such as a semiconductor die, to a substrate are provided. A z-axis anisotropic adhesive is applied to the substrate and the component is placed on the anisotropic adhesive. During a curing process a cover film is drawn over the component and substrate to maintain the anisotropic adhesive in compression. A conveyorized curing apparatus includes a conveyor belt for moving the substrate through a heated process chamber. The cover film is mounted on an endless belt and is adapted to move at a same speed as the conveyor belt. As the die and substrate are moved through the process chamber, a vacuum plenum draws the cover film over the die and substrate to exert a uniform force on the component.

23 Claims, 2 Drawing Sheets

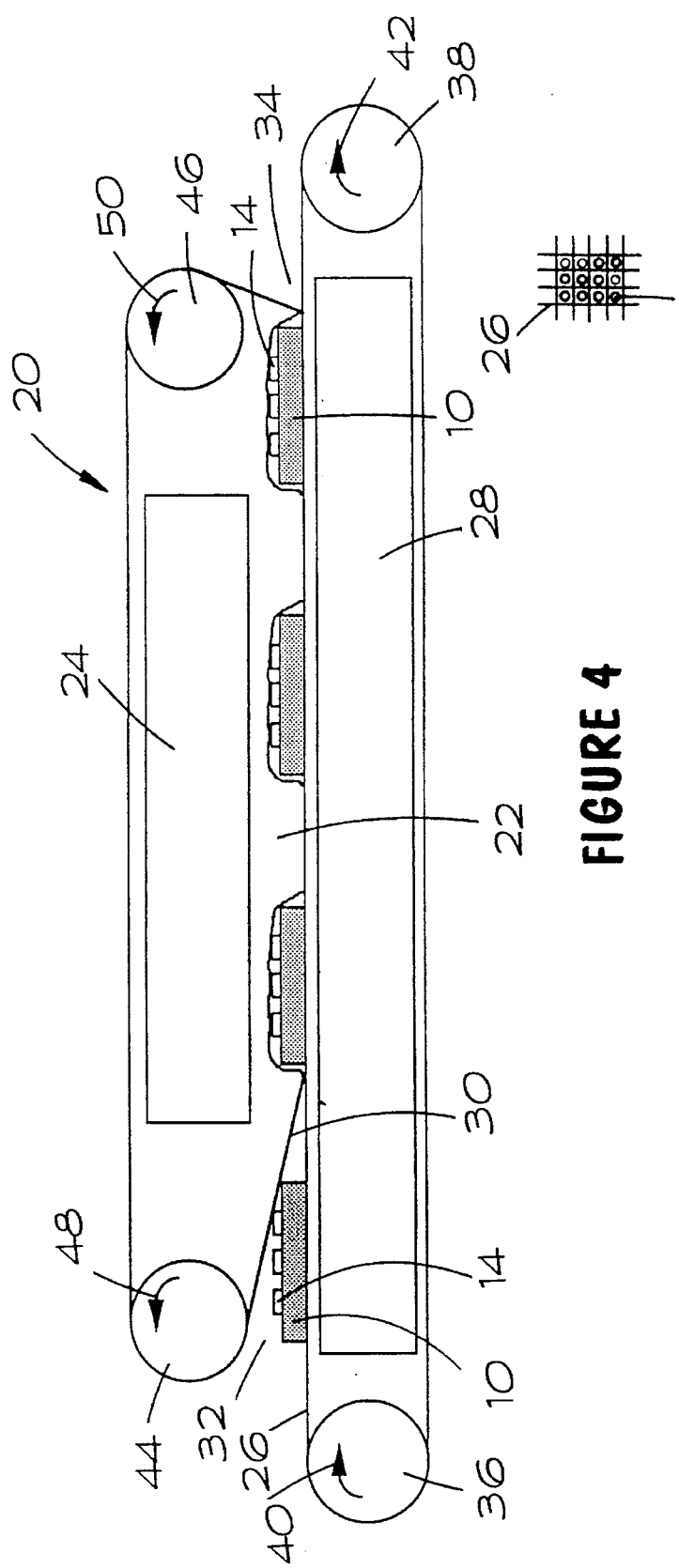
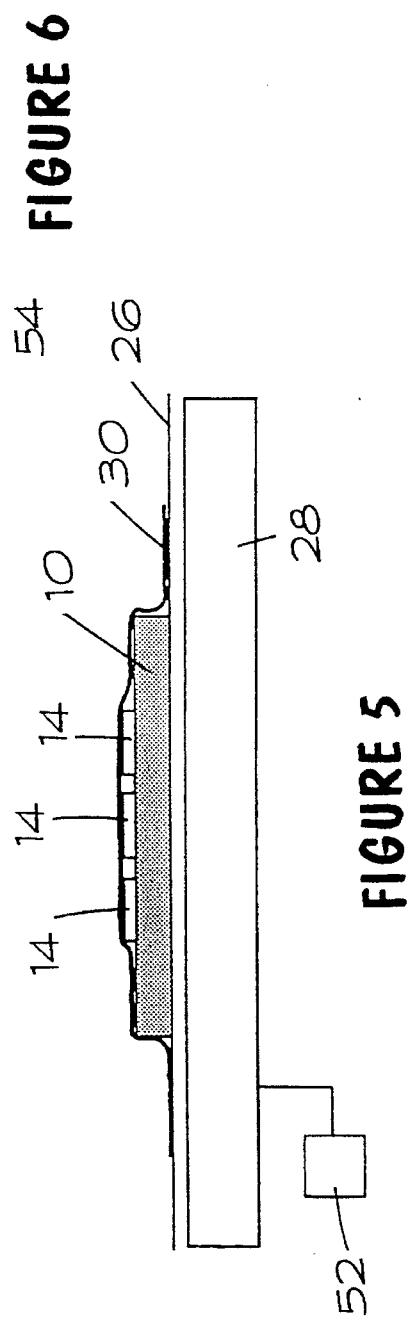

METHOD AND APPARATUS FOR MOUNTING A COMPONENT TO A SUBSTRATE USING AN ANISOTROPIC ADHESIVE, A COMPRESSIVE COVER FILM, AND A CONVEYOR

FIELD OF THE INVENTION

This invention relates generally to electronics manufacturing and more particularly to a method and apparatus for mounting a component to a substrate using conductive anisotropic adhesives. The method and apparatus are particularly suited to flip chip mounting unpackaged semiconductor dice on a substrate.

BACKGROUND OF THE INVENTION

In the manufacture of microelectronic packages called hybrids, or multi chip modules, unpackaged semiconductor dice are mounted face down on a substrate such as a printed circuit board. This type of mounting is referred to as flip chip mounting because each unpackaged die is flipped circuit side down onto the substrate. With flip chip mounting the bond pads on the die are in direct electrical contact with corresponding contact pads on the substrate.

One method of attaching a flip chip mounted semiconductor die to a substrate employs anisotropic adhesives. An anisotropic adhesive takes the place of conventional solder and socket connections for securing the die to the substrate and also for establishing an electrical pathway.

Anisotropic adhesives are provided in a variety of forms. Anisotropic adhesives are formed such that electrical resistance in one direction through the material will differ from that measured in another direction. Typically high resistance is provided in at least one orthogonal direction (e.g., x-y direction) while low resistance is provided in the remaining orthogonal direction (e.g., z direction). The conductivity in one direction is typically pressure sensitive requiring that the material be compressed in that direction.

One type of conductive anisotropic adhesive is known as a z-axis anisotropic adhesive. Z-axis anisotropic adhesives are filled with conductive particles to a low level such that the particles do not contact each other in the x-y plane. Compression in the z-direction establishes an electrical path. Z-axis anisotropic adhesives are formed as a viscous paste or as a film that is applied and then cured to harden. Both types of z-axis anisotropic adhesives (film or paste) come in a thermoplastic or thermosetting variety. Thermoplastic anisotropic adhesives are heated to soften for use and then cooled for curing. Thermoset anisotropic adhesives require heat curing. Using an anisotropic adhesive, a die can be adhered to a substrate and multiple connections can be made to the bond pads on the die with a single piece of material.

One problem with flip chip mounting using z-axis anisotropic adhesives is that the conductivity of the material is pressure sensitive. Accordingly the anisotropic adhesive must be compressed during the curing process to establish a permanent electrical connection through the material. In the past, compression of the z-axis anisotropic adhesive has been accomplished by maintaining a load on the die during the curing process. This load is typically applied using some type of mechanical tooling fixture.

One problem with this type of arrangement is that mechanical fixtures tend to be complex and expensive. Mechanical fixtures also have a tendency to damage the die or substrate. In addition, the compressive load must be maintained for a relatively long time period, which is required to sufficiently cure the elastomer (e.g., twenty to thirty minutes). For a high volume manufacturing process this type of curing process is unacceptably long. Additionally, if more than one flip chip is to be attached, a sequential process is used in which one chip is attached and cured, followed by attachment and curing of subsequent chips. This sequential process can result in multiple high temperature exposure of some of the chips.

In view of the foregoing, it is an object of the present invention to provide an improved method and apparatus for mounting components to a substrate using anisotropic adhesives. It is a further object of the present invention to provide an improved method and apparatus for flip chip mounting semiconductor dice to a substrate. It is yet another object of the present invention to provide an improved method and apparatus for flip chip mounting semiconductor dice that are compatible with high volume manufacturing operations. Other objects, advantages and capabilities of the present invention will become more apparent as the description proceeds.

SUMMARY OF THE INVENTION

In accordance with the present invention, an improved method for mounting a component to a substrate using an anisotropic adhesive, and an improved curing apparatus are provided. In an illustrative embodiment the method and apparatus are used for flip chip mounting a semiconductor die to a substrate. Initially, an anisotropic adhesive is applied to the substrate and the die is placed on the anisotropic adhesive. During a heat curing process, a cover film is drawn over the die and substrate. The cover film exerts a uniform force on the die and maintains the anisotropic adhesive in compression.

In an illustrative embodiment, the curing apparatus includes a heat source and a mesh conveyor belt. As the die and substrate are moved by the conveyor belt through the curing apparatus, an endless roll of cover film covers the substrate and die. A vacuum plenum associated with the conveyor belt, draws the cover film over the die and substrate holding these components together and exerting a compressive load on the anisotropic adhesive. As the die and substrate are moved along the heat source, the anisotropic adhesive cures under compression. Once the die and substrate are moved past the vacuum plenum, the cover film withdraws, and the assembled components exit the curing apparatus. In an alternate embodiment, the curing apparatus is formed as a bench top unit rather than with a conveyor belt. The bench top curing apparatus includes a heated platen for the substrate, a vacuum plenum and a cover film that is drawn by the vacuum plenum over the die and substrate.

The method for flip chip bonding, broadly stated, includes the steps of: assembling a die and substrate with an anisotropic adhesive therebetween; drawing a cover film over the die and substrate to compress the anisotropic adhesive; curing the anisotropic adhesive while the anisotropic adhesive is compressed; and then withdrawing the cover film from the die and substrate.

A curing apparatus for flip chip mounting, broadly stated, comprises: an enclosed process chamber; a heat source for heating the process chamber; a conveyor for moving a substrate and die through the process chamber; an endless belt of cover film mounted with respect to the conveyor to move at a same speed as the substrate and die; and a vacuum plenum in fluid communication with a vacuum source and adapted to draw the cover film over the substrate and die.

BRIEF DESCRIPTION OF THE DRAWINGS

FIG. 4 is a schematic view of a conveyorized apparatus constructed in accordance with the invention for flip chip mounting a semiconductor die under a compressive load using an anisotropic adhesive;

FIG. 5 is an enlarged schematic view illustrating a cover film of the apparatus of FIG. 4 drawn over the die and substrate; and FIG. 6 is a schematic view illustrating plan view showing vacuum openings in the apparatus of FIG. 4.

DETAILED DESCRIPTION OF THE PREFERRED EMBODIMENTS

Figure 1A:
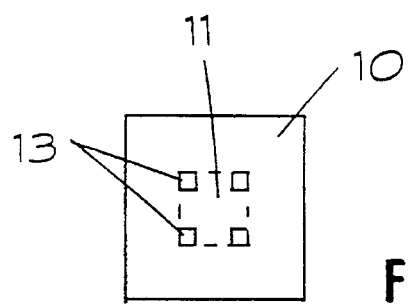
FIG. 1A–1C are schematic diagrams illustrating the assembly of a die and substrate with an anisotropic adhesive therebetween.
Figure 1B:
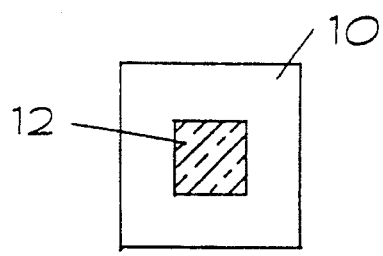
Figure 1C:
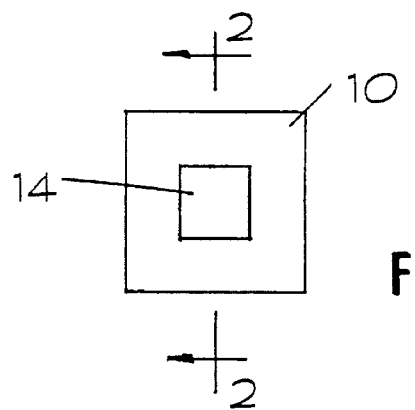

With reference to FIGS. 1A–1C, a substrate 10 is used in the construction of a multi chip module. The substrate 10 will typically be a printed circuit board formed with various circuits and electrical devices. Conductive, resistive and dielectric patterns of a circuit can be formed on the substrate 10 by screen printing or other suitable process.

Figure 3:
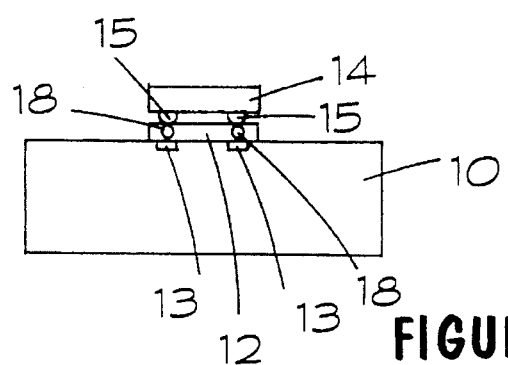
FIG. 3 is an enlarged schematic view illustrating the cured anisotropic adhesive and the conductive path from the die to the substrate.

The substrate 10 includes one or more die mounting areas 11 (FIG. 1A). The die mounting areas 11 include contact pads 13 that are to be electrically connected to corresponding contact locations on a semiconductor die 14 (FIG. 1C). As an example, the contact pads 13 on the substrate 10 can be metal pads in electrical communication with circuit traces (not shown) on the substrate 10. The semiconductor die 14 (FIG. 1C) can include corresponding contact locations formed as metal bumps 15 (FIG. 3). This type of die 14 is known in the art as a bumped die.

As shown in FIG. 1B, a z-axis anisotropic adhesive 12 is applied to the die mounting area 11. The z-axis anisotropic adhesive 12 can be formed as a thermoplastic adhesive. Thermoset epoxy based anisotropic adhesives are often referred to as z-axis conductive epoxies. Suitable z-axis anisotropic adhesives are sold under the trademarks: "X-POLY" and "Z-POXY", by A. I. Technology, Trenton, N.J.; and "SHEL-ZAC", by Sheldahl, Northfield, Minn. Z-axis anisotropic adhesives are also sold by 3M, St. Paul, Minn.

The z-axis anisotropic adhesive 12 can be deposited on the die mounting area 11 using a suitable process. For a z-axis anisotropic adhesive 12 formed as a viscous paste, a screen printing process can be used to dispense the anisotropic adhesive 12 onto the substrate 10 in a desired pattern. For a z-axis anisotropic adhesive 12 formed as a film, the film can be cut and then placed in contact with the die mounting area 11. The z-axis anisotropic adhesive 12 is heated during the deposition process.

Figure 2:
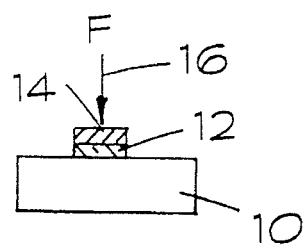
FIG. 2 is a cross sectional view taken along section line 2—2 illustrating application of force during a curing process for the anisotropic adhesive.

Next, as shown in FIG. 1C, the die 14 is placed over the z-axis anisotropic adhesive 12 and the elastomer is cured. As shown in FIG. 2, during the curing process a force F is applied to the die 14. The force F maintains the die 14 over the die mounting area 11 and compresses the z-axis anisotropic adhesive 12. Thermoplastic z-axis anisotropic adhesives are cured by cooling. Thermoset anisotropic adhesives are cured under heat.

In general, the z-axis anisotropic adhesive 12 must be compressed during the curing process to permit conduction in the cured assembly. As shown in FIG. 3, the z-axis anisotropic adhesive 12 includes conductive particles 18 that conduct between the bumps 15 on the die 14 and the contact pads 13 on the substrate 10. The bumps 15 on the die 14 press against the z-axis anisotropic adhesive 12 which presses against the contact pads 13 on the substrate 10. Although conduction is provided in a z-direction, the z-axis anisotropic adhesive 12 provides insulation in the x and y directions.

The pitch or spacing of the bumps 15 and contact pads 13 must be approximately equal. Using this arrangement, numerous low resistance electrical contacts can be made with a single continuous segment of z-axis anisotropic adhesive 12. The z-axis anisotropic adhesive 12 in addition to providing conduction adheres the die 14 to the substrate 10.

Referring now to FIGS. 4 and 5, a conveyorized curing apparatus 20 constructed in accordance with the invention is shown. The conveyorized curing apparatus 20, broadly stated, comprises: an enclosed process chamber 22; a heat source 24 for heating the process chamber 22 to a predetermined temperature; an open mesh conveyor 26 for moving the substrate 10 and flip chip mounted dice 14 through the process chamber 22; an endless belt of cover film 30 adapted to move at a same speed as the conveyor 26; and a vacuum plenum 28 adapted to draw the cover film 30 over the substrate 10 and die 14.

The conveyorized curing apparatus 20 is similar in construction to a conveyorized curing oven. The process chamber 22 for the curing apparatus 20 includes an entrance opening 32 and an exit opening 34. The heat source 24 is adapted to heat the process chamber 22 to a predetermined temperature. Depending on the anisotropic adhesive, this temperature is preferably on the order of 100° C. to 300° C. The heat source 24 can be gas or electric.

The open mesh conveyor 26 is mounted on drive rollers 36, 38 which rotate as indicated by directional arrows 40, 42. The conveyor 26 is adapted to move the substrate 10 and dice 14 through the process chamber 22 from the entrance opening 32 to the exit opening 34 of the curing apparatus 20. The speed of the conveyor 26 is selected to provide a predetermined cure time (e.g., 20–30 minutes) within the process chamber 22.

The vacuum plenum 28 and cover film 30 cooperate to apply a uniform pressure across the substrate 10 and dice 14. This is accomplished as the substrate 10 and dice 14 are moved through the process chamber 22 by the conveyor 26. The cover film 30 moves at the same speed as the conveyor 26. This uniform pressure forces each die 14 and its respective substrate 10 together, and compresses the z-axis anisotropic adhesive 12 (FIG. 2) therebetween.

The cover film 30 is formed as an endless loop of material mounted to a pair of drive rollers 44, 46. The drive rollers 44, 46 rotate as indicated by arrows 48, 50 and move the cover film 30 in the same direction and at the same speed as the conveyor 26.

The cover film 30 can be formed of any flexible, heat resistant material. Suitable materials include thin polymeric or elastomeric materials such as polyester, silicone, rubber (natural or synthetic) or "TEFLON". The cover film 30 can also be formed of metal foil. Another requirement is that the cover film be slightly larger in width than the width of the substrate 10.

The cover film 30 is drawn over the substrate 10 and dice 14 by the vacuum plenum 28. As shown in FIG. 5, the vacuum plenum 28 is in communication with a vacuum source 52. Additionally, as shown in FIG. 6, the vacuum plenum 28 can include vacuum openings 54 for drawing the cover film 30 against the conveyor 26. Preferably, the conveyor 26 is formed of open mesh chain so that the vacuum source 52 has a substantially unobstructed path to the cover film 30.

The placement and construction of the drive rollers 44, 46 for the cover film 30 is such that the cover film 30 is drawn over the substrate 10 and dice 14 as the uncured components pass through the entrance opening 32 for the process chamber. Similarly, the drive rollers 44, 46 are constructed to release the cover film 30 from the substrates 10 and dice 14 as the fully cured components pass through the exit opening 34 for the process chamber 22.

As clearly shown in FIG. 5, the cover film 30 completely envelopes the pre-assembled substrate 10 and dice 14 as these mated components travel through the curing apparatus 20. The vacuum source 52 exerts a negative pressure that is selected to exert a desired force on the cover film 30. The cover film 30 exerts a force on the dice 14 which is on the order of 1 lb/in$^2$ to 20 lbs/in$^2$. In addition this force is exerted uniformly across the back side of the dice 14.

The cover film 30 thus functions to compress the anisotropic adhesive 12 (FIG. 2) during the curing process. As the substrate 10 and dice 14 continue to move through the curing apparatus 20, the anisotropic adhesive 12 is cured. The curing time is determined by the speed of the conveyor 26. At the exit opening 34 the cover film 30 is adapted to pull away from the substrate 10 and dice 14. The force on each die 14 is thus withdrawn and the fully cured components exist the curing apparatus 20.

Thus the invention provides an improved method and apparatus for mounting a component to a substrate particularly adapted for flip chip mounting semiconductor dice on a substrate. While the invention has been described with reference to certain preferred embodiments, as will be apparent to those skilled in the art, certain changes and modifications can be made without departing from the scope of the invention as defined by the following claims.

What is claimed is:

1. A method for mounting a component to a substrate comprising:

placing the component on the substrate with an anisotropic adhesive therebetween;

moving the component and substrate on a conveyor through a chamber;

drawing a cover film moving at a same speed as the conveyor over the component and substrate to compress the anisotropic adhesive;

curing the anisotropic adhesive while under compression; and withdrawing the cover film from the component and substrate.

2. The method as claimed in claim 1 and wherein the anisotropic adhesive is an adhesive selected from the class consisting of thermoplastic z-axis anisotropic adhesives and thermoset z-axis anisotropic adhesives.

3. The method as claimed in claim 1 and wherein the cover film comprises an endless belt adapted to cover the component and substrate at an entrance of the chamber and withdraw from the component and substrate at an exit of the chamber.

4. The method as claimed in claim 1 and wherein the cover film is formed of a material selected from the group consisting of polymeric and elastomeric materials.

5. The method as claimed in claim 1 and wherein drawing the cover film over the component and substrate is with a vacuum directed through the conveyor.

6. A method for mounting a semiconductor die to a substrate comprising:

applying a z-axis anisotropic adhesive to the substrate or to the die;

placing the die on the substrate;

moving the die and substrate on a conveyor belt through a chamber while drawing a cover film moving at a same speed as the conveyor over the die and substrate to exert a force on the die and compress the anisotropic adhesive between the die and substrate;

curing the anisotropic adhesive while under compression; and withdrawing the cover film from the die and substrate.

7. The method as claimed in claim 6 and wherein the z-axis anisotropic adhesive is an adhesive selected from the class consisting of thermoset anisotropic adhesives and thermoplastic anisotropic adhesives.

8. The method as claimed in claim 6 and wherein the z-axis anisotropic adhesive is applied to the die or to the substrate as a paste.

9. The method as claimed in claim 6 and wherein the z-axis anisotropic adhesive is applied to the die or to the substrate as a film.

10. The method as claimed in claim 6 and wherein the cover film is adapted to exert a force on the die of between 1 lb/in$^2$ to 20 lbs/in$^2$.

11. The method as claimed in claim 6 and wherein the die and substrate are moved by the conveyor belt through the chamber at a speed selected to provide a curing time of from 20–30 minutes.

12. The method as claimed in claim 6 and wherein the cover film is drawn over the die and substrate by a vacuum provided by a vacuum plenum located subjacent to the conveyor belt and in flow communication with a vacuum source.

13. The method as claimed in claim 6 and wherein the cover film comprises an endless belt adapted to cover the die and substrate at an entrance of the chamber and withdraw from the die and substrate at an exit of the chamber.

14. The method as claimed in claim 6 and wherein the cover film comprises a material selected from the group consisting of polymeric and elastomeric materials.

15. The method as claimed in claim 6 and wherein the chamber is heated to a temperature of between 100° C. to 300° C.

16. A method for flip chip mounting a semiconductor die to a substrate comprising:

providing the substrate with a contact pad;

applying a z-axis anisotropic adhesive to the contact pad;

placing the die on the anisotropic adhesive;

placing the die and substrate on a conveyor belt adapted to move through a heated process chamber;

drawing a cover film over the die and substrate using a vacuum directed through the conveyor belt, said cover film adapted to apply a force to the die and compress the anisotropic adhesive for establishing an electrical connection between a contact location on the die and the contact pad on the substrate;

curing the anisotropic adhesive while under compression; and withdrawing the cover film from the die and substrate.

17. The method as claimed in claim 16 and wherein the cover film comprises an endless belt driven by drive rollers.

18. The method as claimed in claim 16 and wherein the cover film moves at a same speed as the conveyor belt.

19. The method as claimed in claim 16 and wherein the vacuum is directed through the conveyor belt by a vacuum plenum located subjacent to the conveyor belt.

20. An apparatus for curing an anisotropic adhesive placed between a component and substrate, said apparatus comprising:

a process chamber;

a heat source for heating the process chamber;

a conveyor for moving the substrate through the process chamber;

an endless belt of cover film configured to move through the process chamber at a same speed as the substrate and die; and a vacuum plenum in fluid communication with a vacuum source, said vacuum plenum adapted to draw the cover film over the substrate and component to exert a force on the component and compress the anisotropic adhesive during curing.

21. The apparatus as claimed in claim 20 and wherein the anisotropic adhesive is an adhesive selected from the class consisting of thermoplastic and thermosetting z-axis anisotropic adhesives.

22. The apparatus as claimed in claim 20 and wherein the cover film is mounted on a pair of rollers.

23. The apparatus as claimed in claim 20 and wherein the cover film is formed of a material selected from the group consisting of polymeric and elastomeric materials.

* * * * *